(12) United States Patent
Kurosawa (10) Patent No.: US 8,520,388 B2
(45) Date of Patent: Aug. 27, 2013

(54) HEAT-RADIATING COMPONENT AND ELECTRONIC COMPONENT DEVICE

(75) Inventor: Takuya Kurosawa, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 248 days.

(21) Appl. No.: 12/967,312

(22) Filed: Dec. 14, 2010

(65) Prior Publication Data

US 2011/0149537 A1   Jun. 23, 2011

(30) Foreign Application Priority Data

Dec. 22, 2009  (JP) ................. 2009-290655

(51) Int. Cl.
*H05K 7/20* (2006.01)

(52) U.S. Cl.
USPC ............................ 361/700; 361/704; 361/710

(58) Field of Classification Search
USPC ................. 361/700–710; 257/685–686; 165/104.31–104.33, 287

See application file for complete search history.

(56) References Cited

U.S. PATENT DOCUMENTS

| | | | |
|---|---|---|---|
| 6,707,671 B2 | 3/2004 | Yamashita | |
| 6,822,867 B2 * | 11/2004 | Hsieh | 361/704 |
| 7,041,535 B2 | 5/2006 | Yamashita | |
| 7,633,752 B2 * | 12/2009 | Prasher | 361/688 |
| 2005/0111188 A1 * | 5/2005 | Bhattacharya et al. | 361/699 |
| 2008/0128897 A1 * | 6/2008 | Chao | 257/713 |
| 2008/0174963 A1 * | 7/2008 | Chang et al. | 361/700 |

FOREIGN PATENT DOCUMENTS

| | | |
|---|---|---|
| JP | 2003-51573 A1 | 2/2003 |
| JP | 2004-119882 A1 | 4/2004 |

\* cited by examiner

*Primary Examiner* — Tuan T Dinh (74) *Attorney, Agent, or Firm* — Kratz, Quintos & Hanson, LLP (57) ABSTRACT

A heat-radiating component is bonded via a thermal interface material (TIM) to an electronic component (chip) mounted on a wiring board. The heat-radiating component includes a plate-like portion thermally bonded to the chip through the TIM, and a foot portion formed on a surface which faces the electronic component, of the plate-like portion. The foot portion is formed in a ring shape at a position which surrounds a region corresponding to a mounting area of the electronic component, on the inner side of the periphery of the plate-like portion.

4 Claims, 5 Drawing Sheets

HEAT-RADIATING COMPONENT AND ELECTRONIC COMPONENT DEVICE

CROSS-REFERENCE TO RELATED APPLICATION

This application is based upon and claims the benefit of priority of the prior Japanese Patent Application No. 2009-290655, filed on Dec. 22, 2009, the entire contents of which are incorporated herein by reference.

FIELD

The embodiments discussed herein are related to a heat-radiating component and an electronic component device. More specifically, they relate to a heat-radiating component bonded via a thermal interface material to an electronic component such as a semiconductor element (chip) mounted on a wiring board, and also to an electronic component device using the heat-radiating component.

A wiring board in such an electronic component device is also referred to as a "package" in the following description for the sake of convenience. This is because passive elements such as chip capacitors are mounted on the wiring board in addition to the semiconductor element.

BACKGROUND

A semiconductor element (chip) used as a microprocessor unit (MPU) or the like is electrically connected and fixed (for example, flip-chip bonded) onto a wiring board (package). Since the semiconductor element is brought to an extremely high temperature state during its operation, the temperature of the semiconductor element has to be forcibly reduced. Otherwise, the semiconductor element cannot exhibit its performance, and even worse, may break down in some cases.

For this reason, a heat-radiating component (for example, metal heat spreader) for releasing heat generated by the semiconductor element into the atmosphere is mounted on the semiconductor element. This secures a route through which the heat generated by the semiconductor element is released to the outside. In this configuration, the semiconductor element and the heat spreader are thermally bonded to each other with a material called a thermal interface material (TIM) interposed therebetween. Specifically, the unevenness on each of the surfaces of the semiconductor element and the heat spreader is absorbed by interposing the TIM, thereby reducing the contact thermal resistance between the surfaces. This allows smooth heat conduction from the semiconductor element to the heat spreader. Such thermal interface material (TIM) includes one formed of a high thermal conductivity material such as silicone grease, indium, or graphite into a sheet shape by using a resin binder.

Figure 5:
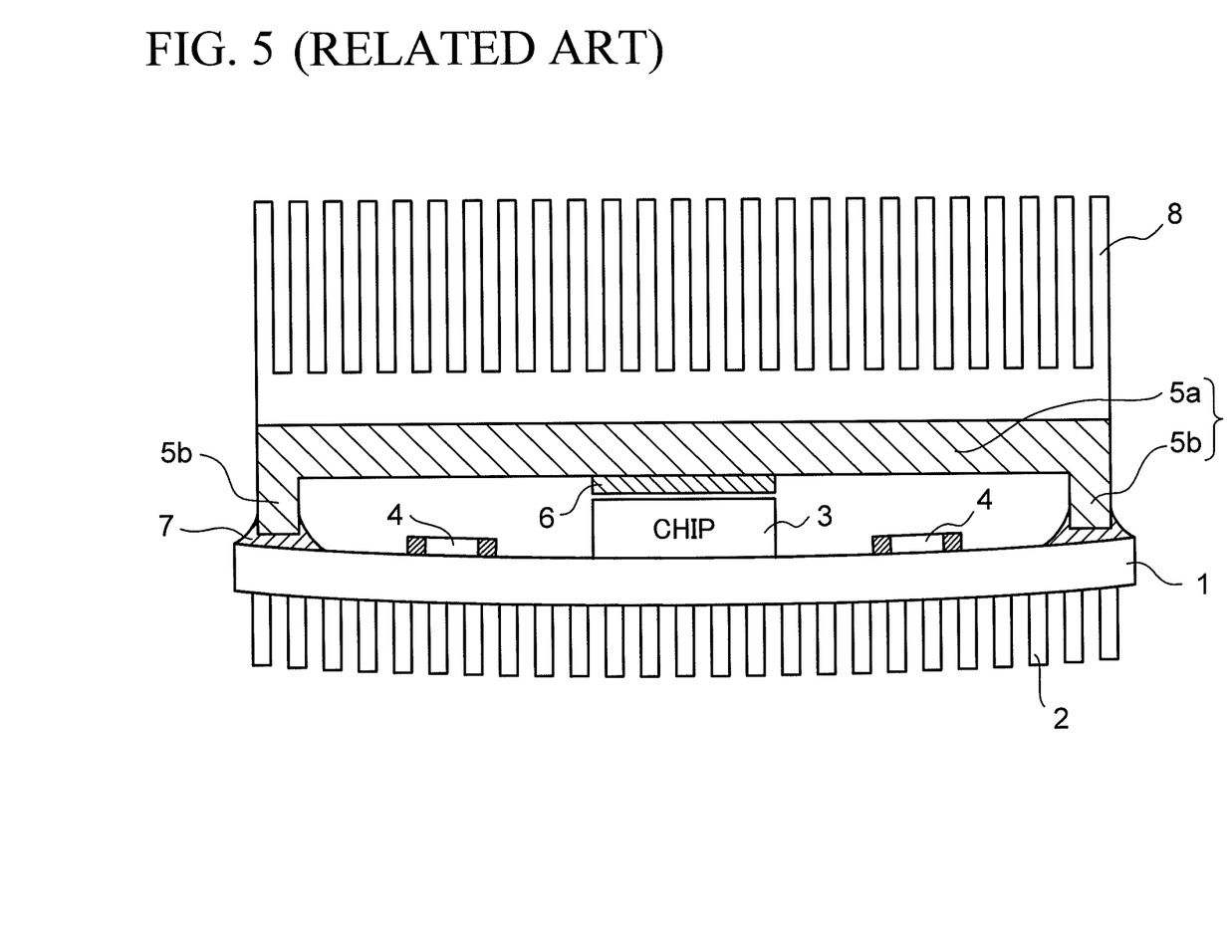
FIG. 5 is a view for explaining a configuration of a semiconductor device using a heat spreader as an example of the related art, and problems encountered in the semiconductor device.

FIG. 5 illustrates, as an example of the related art, a configuration of a semiconductor device using a heat spreader. In FIG. 5, reference numeral 1 denotes a wiring board (package), reference numeral 2 denotes pins serving as external connection terminals of the package 1, reference numeral 3 denotes a semiconductor element (chip which generates large amount of heat, such as CPU) mounted on the package 1, reference numeral 4 denotes chip capacitors for decoupling mounted around an mounting area of the chip 3, and reference numeral 5 denotes a heat spreader. The heat spreader 5 has a structure in which its main portion is formed in a plate shape (plate-like portion 5a), and a foot portion 5b is integrally formed on the periphery of the plate-like portion 5a. The heat spreader 5 is thermally bonded to the chip 3 with a thermal interface material (TIM) 6 interposed between the plate-like portion 5a and the chip 3. In addition, the heat spreader 5 is mechanically connected to the package 1 with a sealant 7 interposed between the foot portion 5b and the package 1. Namely, the heat spreader 5 is mounted in such a manner that the chip capacitors 4 are sealed therein together with the semiconductor chip 3. In addition, a heat sink 8 is mounted on the heat spreader 5.

An example of a technique related to such conventional art is described in Patent document 1 (Japanese Laid-open Patent Publication No. 2003-51573). The Patent document 1 discloses a power module in which a wiring board having a heat generating component electrically connected thereto and a heat sink are connected to each other via a heat-conductive electrically-insulating member (paragraph 0084, FIG. 7). Moreover, as another technique related to the conventional art, there is a semiconductor device described in Patent document 2 (Japanese Laid-open Patent Publication No. 2004-119882). In this semiconductor device, a semiconductor element is flip-chip bonded onto a recessed portion in a multilayer circuit board, passive elements are mounted on the board in an area around the recessed portion, and a heat-radiating member is bonded to a surface of the semiconductor element through a bonding material (paragraph 0027, FIG. 1).

In the configuration of the semiconductor device using the heat spreader illustrated in FIG. 5, the heat spreader 5 is mounted in such a manner that the chip capacitors 4 mounted around the semiconductor chip 3 are also sealed. Accordingly, a distance between a position where the foot portion 5b is fixed to the board 1 through the sealant 7 and a position where the chip 3 is mounted on the board 1 is relatively long. Thus, there is a case where the TIM 6 could not follow the thermal behavior of the board 1 (bending of the board 1 which may occur due to heat generated by the chip 3).

Namely, when heat is applied to the board (package) 1, the package 1 bends outward (downward in the illustrated example) as illustrated in FIG. 5 at the position where the foot portion 5b is fixed to the substrate 1 by the sealant 7. In this state, the contact state of the TIM 6 with the chip 3 or with the heat spreader 5 changes, or the thickness of the TIM 6 changes. Thus, a thermally unstable state occurs. As a result, heat is not conducted smoothly from the chip 3 to the heat spreader 5, and stable heat radiation property cannot be maintained.

In particular, where an inexpensive grease is used as the material of the TIM 6, the TIM 6 may be partially peeled off from the chip 3 or the heat spreader 5 upon bending of the package 1 (in the illustrated example, a state where the TIM 6 is peeled off from the chip 3 is exaggeratedly illustrated). In such case, the heat resistance becomes high in the peeled off area, and thus the TIM 6 cannot exhibit its high heat-conductivity.

Moreover, the heat spreader 5 seals on the package 1, the chip 3 such as CPU which generates large amount of heat, and a portion where the chip 3 is thermally bonded in a recessed portion of the heat spreader 5 is only partial. Thus, hot air tends to be accumulated in the recessed portion of the heat spreader 5. From this point of view as well, there remains room for improving the heat radiating performance.

SUMMARY

According to one aspect of the invention, there is provided a heat-radiating component capable of being bonded via a thermal interface material to an electronic component mounted on a wiring board, the heat-radiating component including a plate-like portion thermally bonded to the electronic component through the thermal interface material, and a foot portion formed on a surface which faces the electronic component, of the plate-like portion, wherein the foot portion is formed in a ring shape at a position which surrounds a region corresponding to a mounting area of the electronic component, on the inner side of the periphery of the plate-like portion.

According to another aspect of the invention, there is provided an electronic component device including an electronic component mounted on a wiring board, a heat-radiating component bonded via a thermal interface material to the electronic component, the heat-radiating component including a plate-like portion thermally bonded to the electronic component through the thermal interface material, and a foot portion formed on a surface which faces the electronic component, of the plate-like portion, wherein the foot portion is formed in a ring shape at a position which surrounds a region corresponding to a mounting area of the electronic component, on the inner side of the periphery of the plate-like portion, and a further heat-radiating component mounted on a surface of the plate-like portion on the opposite side to the surface facing the electronic component.

The object and advantages of the invention will be realized and attained by means of the elements and combinations particularly pointed out in the claims.

It is to be understood that both the forgoing general description and the following detailed description are exemplary only and explanatory and are not restrictive of the invention, as claimed.

DESCRIPTION OF EMBODIMENTS

Preferred embodiments of the present invention will be explained with reference to the accompanying drawings.

First Embodiment

Figure 1:
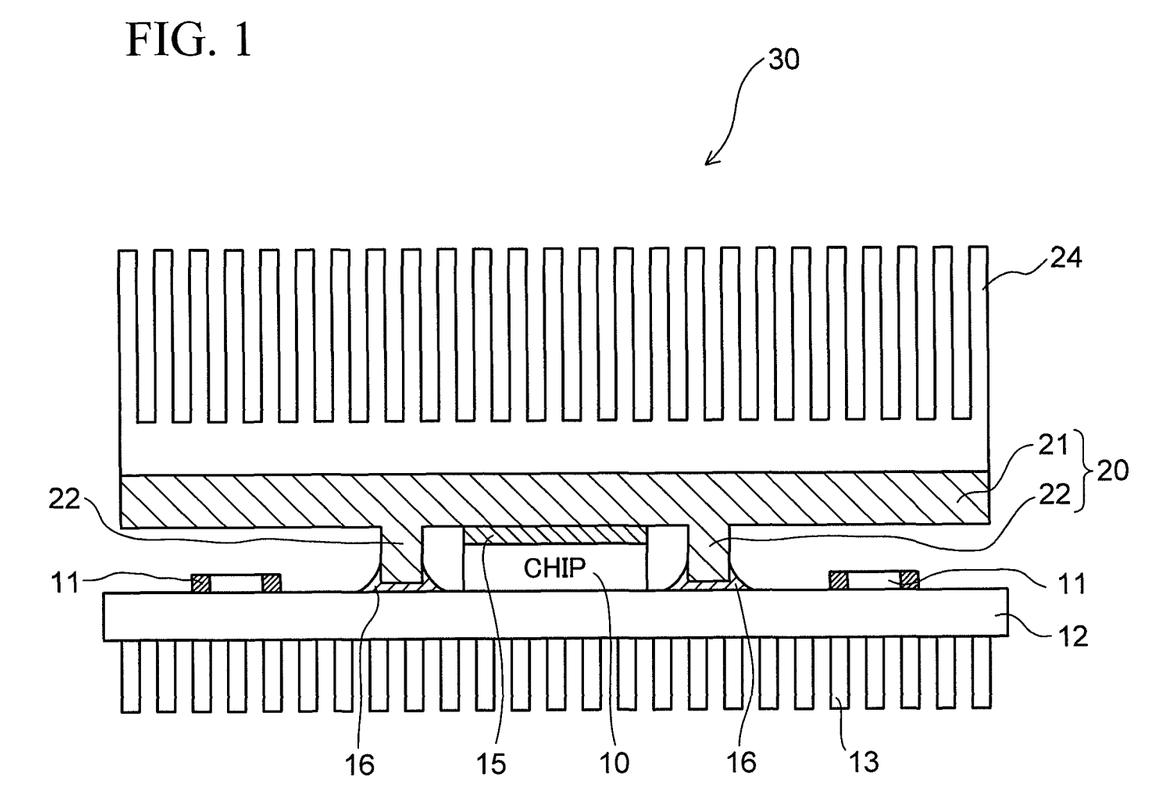
FIG. 1 is a cross-sectional view illustrating a configuration of a semiconductor device (electronic component device) using a heat spreader (heat-radiating component) according to a first embodiment.
Figure 2A:
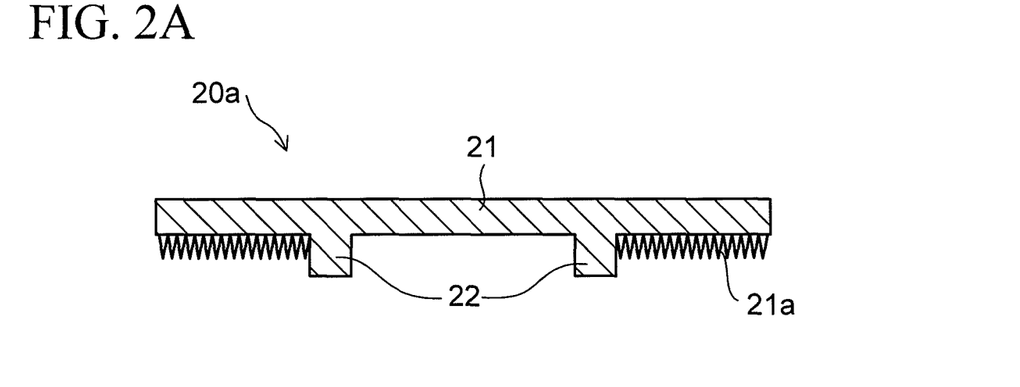
FIGS. 2A to 2C are each a cross-sectional view illustrating a configuration according to a modification of the heat spreader according to the first embodiment.
Figure 2B:
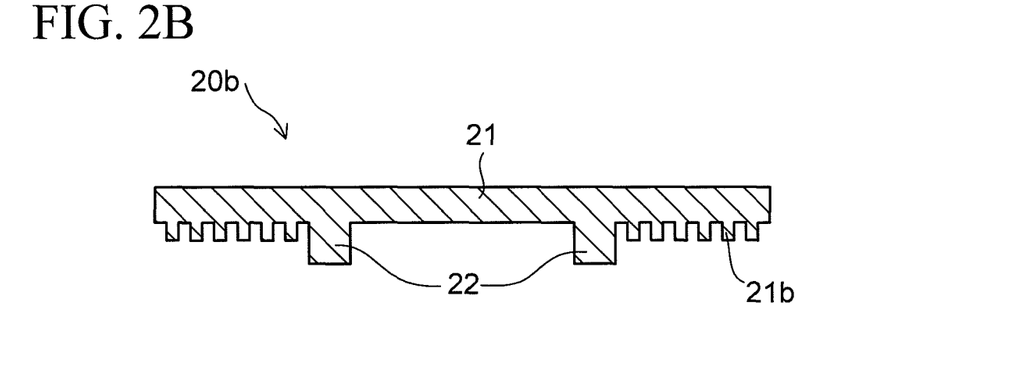
Figure 2C:
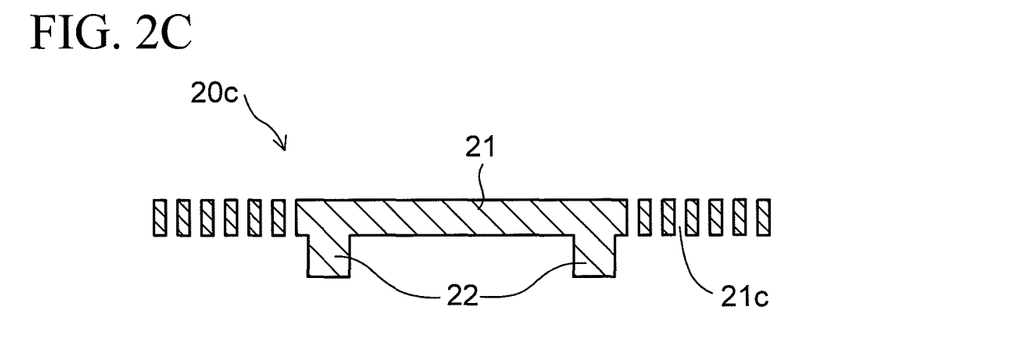

See FIGS. 1 and 2

FIG. 1 illustrates in a cross-sectional view, a configuration of a semiconductor device (electronic component device) using a heat spreader (heat-radiating component) according to a first embodiment.

A semiconductor device 30 of the embodiment basically includes a semiconductor element (logic chip such as CPU which generates large amount of heat) 10 which is an electronic component being a target for heat radiation, a pin grid array (PGA) package (wiring board) 12 on which the chip 10 is mounted on one surface thereof, a heat spreader 20 mounted on the package 12 while being bonded to the chip 10 with a thermal interface material (TIM) 15 interposed therebetween, and a heat sink 24 mounted on the heat spreader 20. In addition, multiple chip capacitors 11 for decoupling are mounted on the package 12 around a mounting area of the semiconductor chip 10, in which the chip capacitors 11 support high speed operation of the chip 10 (CPU or the like).

A resin substrate is used for the wiring board (package) 12. As the resin substrate, a resin substrate having the following structure is sufficient. At least pads (portions defined at required position of a wiring layer covered by a solder resist layer) exposed from the outermost insulating layers (solder resist layers) are electrically connected to each other through an inner portion of the substrate. Wiring layers may be formed inside the resin substrate (package 12). In the case where wiring layers are formed inside the resin substrate, multiple wiring layers are stacked with an inter-layer insulating layer (resin layer) interposed between each adjacent two wiring layers. Here, the outermost wiring layers (pads) are connected to each other through the wiring layers and the vias formed in the resin layers. An example of such a resin substrate is a multilayer wiring board formed using a build-up process.

As illustrated, pins 13 serving as external connection terminals are bonded on a surface of the resin substrate (package 12) on the opposite side to a surface on which the semiconductor chip 10 and the chip capacitors 11 are mounted. The form of the external connection terminals is not limited to bonding of the pins 13 as in the illustrated example, as a matter of course. A ball grid array (BGA) package structure may be used in which, instead of the pins 13, solder balls are bonded to the pads. Moreover, such bonding of the external connection terminals is not necessarily required, and the pads may be exposed so that external connection terminals can be bonded later when necessary (land grid array (LGA) package structure).

The semiconductor chip 10 being the target of heat radiation is mounted on the package 12 with its face (surface on which a circuit is formed) facing downward. Although the specific illustration of a connecting portion between the package 12 and the chip 10 is omitted, a configuration of this portion is same as that in a case where a chip is flip-chip connected to a general package. Specifically, electrode terminals of the chip 10 are electrically connected, through solder bumps or like, to the pads exposed from the outermost insulating layer (insulting layer) of the package 12 (flip-chip mounted). Furthermore, underfill resin (not illustrated) such as thermosetting epoxy-based resin is filled into a gap between the mounted chip 10 and the package 12. Then, the chip 10 and the package 12 are mechanically bonded to each other by the thermosetting.

A surface (surface on the side exposed) of the semiconductor chip 10 on the opposite side to the face is thermally bonded to the heat spreader 20 through the thermal interface material (TIM) 15. A material of the TIM 15 is not particularly limited, and a material having at least a high thermal conductivity is sufficient. Specifically, used is a material with high thermal conductivity such as indium, silicone (or hydrocarbon) grease, metal filler, or graphite formed into a sheet shape by using resin binder.

For example, in a case of indium, a sheet-shaped indium is interposed between the chip 10 and the heat spreader 20, and the heat spreader 20 and the package 12 are fixed to each other temporarily by using a resin material (sealant 16) which cures at a temperature below the melting point of indium. Then, reflow is preformed at a temperature higher than the melting point of indium, and the heat spreader 20 and the chip 10 are bonded to each other while the thickness of indium is controlled. In this case, processing has to be performed with care to prevent occurrence of voids during the reflow.

Note that, indium is relatively expensive and is a rare metal. Thus, a case where indium is not readily available can be expected. Moreover, indium requires heat treatment such as reflow, and is relatively hard to handle in terms of processing steps. In view the above, grease which requires no heat treatment and is relatively inexpensive is preferably used as a material for the TIM 15.

The heat spreader 20 is used to transmit heat generated during the operation of the chip 10 (CPU or the like) to the heat sink 24 so that the heat is dissipated. Copper (Cu) is used as a material for the heat spreader 20, and a nickel (Ni) plating is applied to the surface of the heat spreader 20. As illustrated in the drawing, the heat spreader 20 includes a plate-like portion 21 which is thermally bonded to the chip 10 through the TIM 15 at its center portion, and a foot portion 22 which is formed on a surface of the plate-like portion 21 facing the chip 10.

The foot portion 22 is formed at such a position as to surround a region corresponding to the mounting area of the chip 10, on the inner side of the periphery of the plate-like portion 21. Here, note that, the formation area of the foot portion 22 is selected to be on the inner side of areas corresponding to areas where the chip capacitors 11 are mounted on the package 12. Specifically, the foot portion 22 is formed into a square or rectangular ring shape to comply with the shape of the chip 10 in a plan view, which is square or rectangular.

The heat spreader 20 is bonded to the package with the sealant 16 interposed between the ring-shaped foot portion 22 and a portion on the package (wiring board) 12 corresponding to the foot portion 22. In this configuration, the chip capacitors 11 on the package 12 are positioned outside the heat spreader 20 (foot portion 22). Thermosetting resin typified by, for example, epoxy-based resin, polyimide-based resin, and the like is used as a material of the sealant 16.

The heat spreader 20 can be manufactured as follows. First, a thick copper plate having a required size (for example, approximately 40×40 mm) is prepared. Next, a recessed portion having a required depth is formed on one surface of the copper plate by removing portions (portions on the inner and outer sides of a ring-shaped portion) other than a predetermined portion (the ring-shaped portion surrounding the area corresponding to the chip mounting area) on the inner side of the periphery of the copper plate by pressing, cutting, etching and the like. The depth is selected appropriately according to the thickness of the chip 10 and the thickness of the TIM 15. Then, nickel (Ni) plating is applied to the entire surface of the copper plate, and the required heat spreader 20 is obtained.

Aluminum or aluminum alloy is preferably used as a material for the heat sink 24 mounted on the heat spreader 20 from a view point that aluminum or aluminum alloy is light in weight, easy to process, and low in cost. Such characteristics are preferable because the heat sink 24 is mounted on the heat spreader 20 and needs to be formed into a fin structure to efficiently dissipate heat transmitted from the heat spreader 20 into the atmosphere.

As described above, in the configuration of the semiconductor device 30 using the heat spreader 20 (FIG. 1) according to the embodiment, the foot portion of the heat spreader 20 is provided in the predetermined area on the inner side of the periphery of the plate-like portion 21 (area which surrounds the area corresponding to the mounting area of the chip 10 and which is on the inner side of the areas corresponding to the mounting areas of the chip capacitors 11). Accordingly, the foot portion 22 can be positioned close to the chip 10. In other words, a distance between the position (base point of bending of the board 12, the bending caused by heat generated during the operation of the chip 10) where the foot portion 22 of the heat spreader 20 is fixed on the board 12 with the sealant 16 interposed therebetween, and the position where the chip 10 is mounted on the board 12 can be made short. Thus, even when the board 12 warps due to heat, the degree of the warp (bending) can be made extremely small.

This allows the TIM 15 interposed between the chip 10 and the heat spreader 20 to flexibly follow the warp of the board 12 (that is, the TIM 15 is hardly affected by the warp of the board 12, and has a stable thickness), and to maintain a thermally stable state. As a result, smooth thermal conduction from the chip 10 to the heat spreader 20 is maintained, and heat radiation can be made stable.

In addition, a portion (a portion of the plate-like portion 21 which is on the outer side of the formation area of the foot portion 22 and which is on the surface with the foot portion 22 formed thereon, and a sidewall portion of the foot portion 22) of the heat spreader 20 on the outer side of the formation area of the foot portion 22 also functions as a heat-radiating portion. Thus, the heat radiation performance of the heat spreader 20 as a whole can be improved.

FIGS. 2A to 2C are cross-sectional views each illustrating a configuration according to a modification of the heat spreader 20 of the first embodiment.

First, a heat spreader 20a according to a first modification illustrated in FIG. 2A is configured as follows. A large number of needle-shaped projected portions 21a are provided on one surface (surface with the foot portion 22 formed thereon) of the plate-like portion 21 in an area on the outer side of the formation area of the foot portion 22. The other configuration is same as that of the first embodiment (FIG. 1), and thus description thereof is omitted.

The needle-shaped projected portions 21a can be formed using various methods. Although detailed description of the methods are omitted herein since they are not related to the gist of the invention, the required needle-shaped projected portions 21a can be formed using a plating method, an evaporation method, or the like.

For example, needle shaped projections may be formed on the surface (one surface of the plate-like portion 21 in the area on the outer side of the formation area of the foot portion 22) of the heat spreader 20a by electroless copper plating. Specifically, needle-shaped projected portions 21a with a height of approximately 1 μm is formed on the surface of the heat spreader 20a by the following method. Electroless copper plating is applied to the surface of the heat spreader 20a by using plating solution in which hypophosphoric acid as reducing agent is added to copper-nickel-phosphorus.

As another method for forming the required projected portions 21a, for example, a large number of carbon nanotubes can be grown on the surface of heat spreader 20a by using a CVD method. Instead of growing carbon nanotubes on the heat spreader 20a, for example, carbon nanotubes may be firstly formed on a supporting medium (temporary substrate) made of a silicon substrate or the like, and then transferred onto the surface of the heat spreader 20a.

According to the heat spreader 20a of the first modification, surface processing of forming a needle shape (formation of projected portions 21a) is applied to the plate-like portion 21 in the area on the outer side of the formation area of the foot portion 22. Thus, the surface area (heat radiation area) of this area can be increased. This can further improve the heat radiation property compared to the heat spreader (FIG. 1) of the above-descried embodiment. The heat radiation property can be further improved when carbon nanotubes are used as a material for the projected portions 21a particularly, since carbon nanotubes are excellent in heat conductivity.

This configuration is effective not only because the heat radiation area increases, but also because of the following point. Specifically, the heat sink 24 (FIG. 1) mounted on the heat spreader 20a is made of aluminum or aluminum alloy, and such material has a larger heat resistance than a material (copper) forming the heat spreader 20a. Thus, a more effective heat radiation measure can be taken by increasing the surface area of the copper material (heat spreader 20a) with smaller heat resistance.

Next, a heat spreader 20b according to a second modification illustrated in FIG. 2B is configured as follows. As in the above-described first modification, a large number of fin-shaped projected portions 21b are provided on one surface (surface with the foot portion 22 formed thereon) of the plate-like portion 21 in an area on the outer side of the formation area of the foot portion 22. The projected portions 21b are mechanically formed by cutting or by using a die. The other configuration is same as that of the first embodiment (FIG. 1), and thus description thereof is omitted.

In the heat spreader 20b of the second modification, the surface area (heat radiation area) of the area on the outer side of the formation area of the foot portion 22 in the plate-like portion 21 can be increased as in the first modification (FIG. 2A). This can further improve the heat radiation property.

Next, a heat spreader 20c according to a third modification illustrated in FIG. 2C is configured as follows. A large number of opening portions 21c are provided in the plate-like portion 21 in the area on the outer side of the formation area of the foot portion 22, the opening portions 21c penetrating the plate-like portion 21 in the thickness direction thereof. The opening portions 21c can be formed by pressing or the like. The other configuration is same as that of the first embodiment (FIG. 1), and thus description thereof is omitted.

According to the heat spreader 20c of the third modification, the heat radiation area of the area on the outer side of the formation area of the foot portion 22 in the plate-like portion 21 can be increased as in the above modifications, although there is a difference in configuration that the opening portions 21c are provided in place of the projected portions 21a and 21b. This can further improve the heat radiation property.

Second Embodiment

Figure 3:
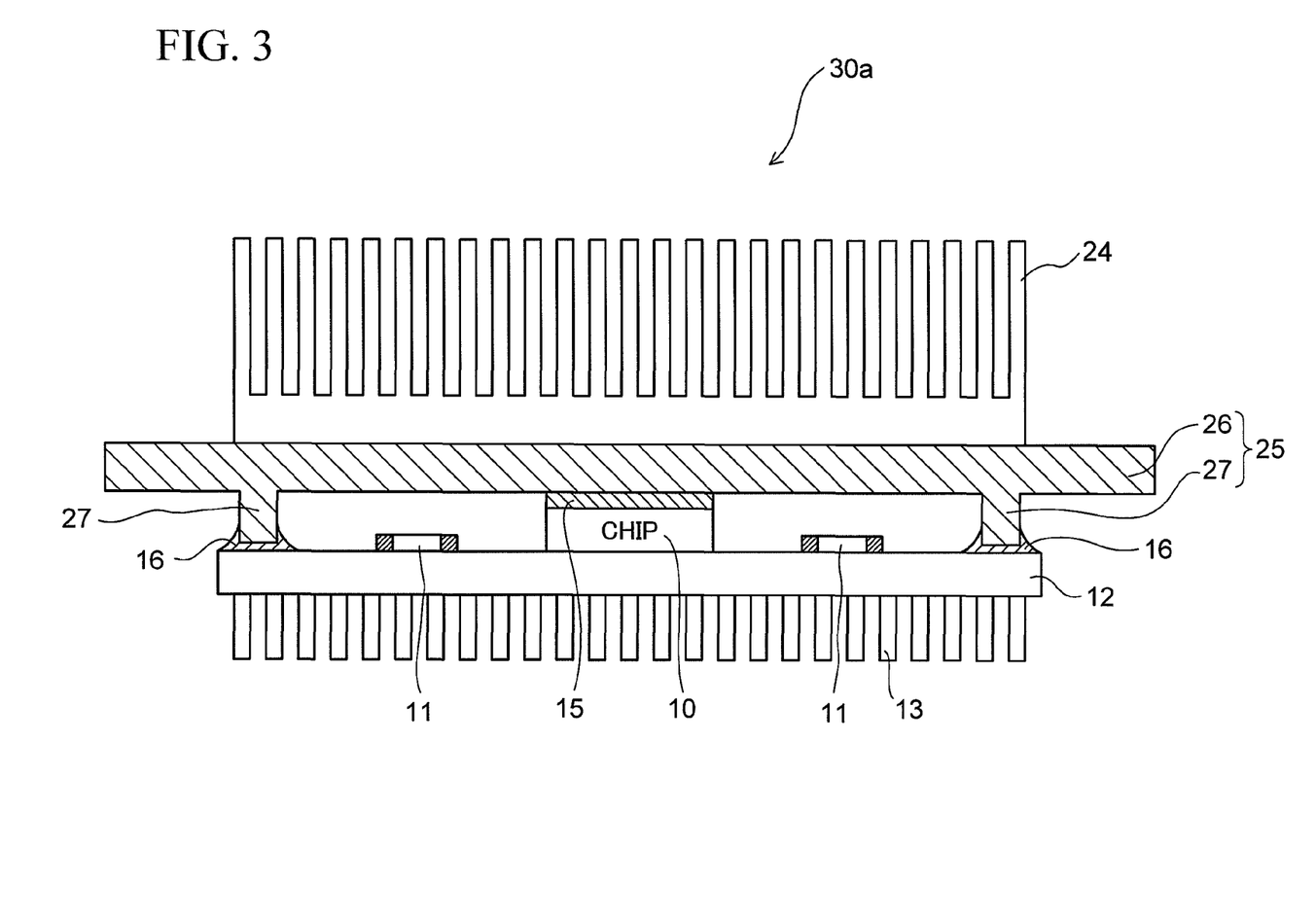
FIG. 3 is a cross-sectional view illustrating a configuration of a semiconductor device (electronic component device) using a heat spreader (heat-radiating component) according to a second embodiment.
Figure 4A:
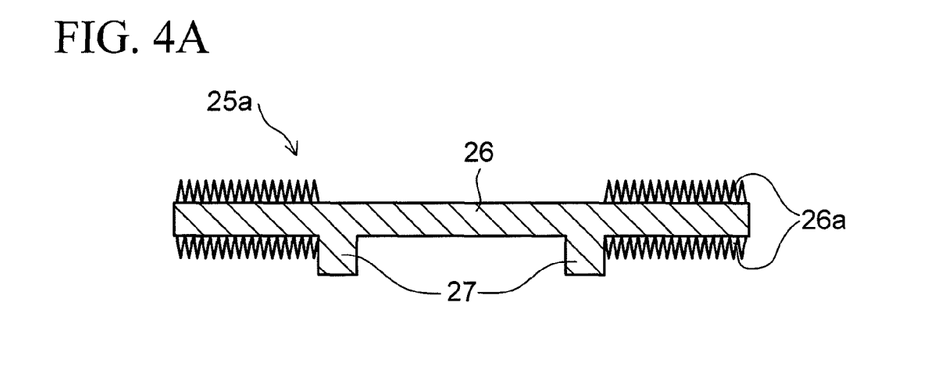
FIGS. 4A to 4C are each a cross-sectional view illustrating a configuration according to a modification of the heat spreader according to the second embodiment.
Figure 4B:
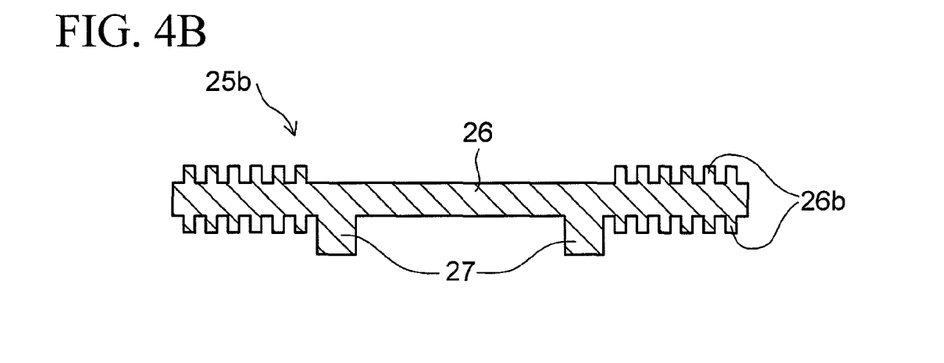
Figure 4C:
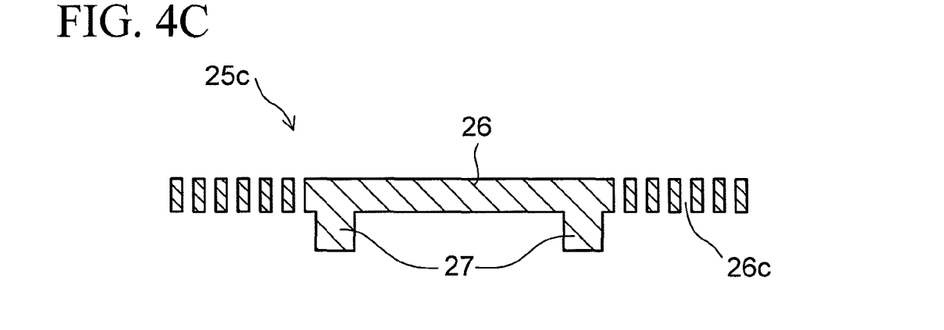

See FIGS. 3 and 4

FIG. 3 illustrates in a cross-sectional view, a configuration of a semiconductor device (electronic component device) using a heat spreader (heat-radiating component) according to a second embodiment.

The semiconductor device 30a of the embodiment is different only in the shape and mounted area of a heat spreader 25, compared to the semiconductor device (FIG. 1) of the first embodiment described above. The other configuration is same as that of the first embodiment, and thus description thereof is omitted.

The heat spreader 25 according to the second embodiment is configured as follows. As similar in the first embodiment, a foot portion 27 is formed at such a position as to surround a region corresponding to a mounting area of the chip 10, on the inner side of the periphery of a plate-like portion 26. However, the formation area of the foot portion 27 is selected to be on the outer side of areas corresponding to areas where the chip capacitors 11 are mounted on the package 12 and the area corresponding to the periphery of the package 12.

The heat sink 24 is mounted on a surface of the plate-like portion 26 on the opposite side to a surface facing the chip 10, and is disposed in an area on the inner side of the formation area of the foot portion 27. In other words, as illustrated in the drawings, a portion of the plate-like portion 26 on the outer side of the formation area of the foot portion 27 protrudes horizontally from side end surfaces of the heat sink 24.

In the configuration of the semiconductor device 30a using the heat spreader 25 according to the second embodiment, the foot portion 27 of the heat spreader 25 is provided at the predetermined position on the inner side of the periphery of the plate-like portion 26 as in the above-described first embodiment, and the portion of the plate-like portion 26 on the outer side of the formation area of the foot portion 27 can function as a radiation portion. Thus, the heat radiation performance of the heat spreader 25 as a whole can be improved. Moreover, spaces above and below the portion of the plate-like portion 26 on the outer side of the formation area of the foot portion 27 are left open in the second embodiment. This can further improve the heat radiation property compared to the plate-like portion 21 of the first embodiment.

Note that, since the formation area of the foot portion 27 is on the outer side of the mounting area of the chip capacitor 11 in the second embodiment, a distance between the formation area and the mounting area of the chip 10 is longer than that in the first embodiment. Thus, assumed is a case where the TIM 15 interposed between the chip 10 and the heat spreader 25 cannot follow the warp of the board 12 flexibly when the board 12 warps due to heat. In such case, it is preferable to change the shape of the heat spreader 25 appropriately, in order that the formation area of the foot portion 27 is made as close as possible to the chip 10.

FIGS. 4A to 4C are cross-sectional views each illustrating a configuration according to a modification of the heat spreader 25 according to the second embodiment.

First, a heat spreader 25a according to a first modification illustrated in FIG. 4A is configured as follows. A large number of needle-shaped projected portions 26a are provided on each of top and bottom surfaces of the plate-like portion 26 in the portion on the outer side of the formation area of the foot portion 27. The projected portions 26a can be formed using a plating method, an evaporation method, a CVD method, or the like as in the first modification (FIG. 2A) of the first embodiment described above. The other configuration is same as that of the second embodiment (FIG. 3), and thus description thereof is omitted.

According to the heat spreader 25a of the first modification, surface processing of forming a needle shape (formation of projected portions 26a) is applied to the top and bottom surfaces of the plate-like portion 26 in the portion on the outer side of the formation area of the foot portion 27. Thus, the surface area (heat radiation area) of this portion can be increased. This can further improve the heat radiation property compared to the case of the second embodiment (FIG. 3). Moreover, focusing on the portions on the outer side of the formation area of the foot portion 27, the heat radiation property is further improved compared to the case of the first modification (FIG. 2A) of the first embodiment described above.

Next, a heat spreader 25b according to the second modification illustrated in FIG. 4B is configured as follows. As in the above-described first modification (FIG. 4A), a large number of fin-shaped projected portions 26b are provided on the top and bottom surfaces of the plate-like portion 26 in the portion on the outer side of the formation area of the foot portion 27. The projected portions 26b can be formed by cutting or the like as in the second modification (FIG. 2B) of the first embodiment described above. The other configuration is same as that of the second embodiment (FIG. 3), and thus description thereof is omitted.

In the heat spreader 25b of the second modification also, the surface area (heat radiation area) of the portion of the plate-like portion 26 on the outer side of the formation area of the foot portion 27 can be increased as in the first modification (FIG. 4A) of the second embodiment described above. This can further improve the heat radiation property. Moreover, focusing on the portions on the outer side of the formation area of the foot portion 27, the heat radiation property is further improved compared to the case of the second modification (FIG. 2B) of the first embodiment described above.

Next, a heat spreader 25c according to the third modification illustrated in FIG. 4C is configured as follows. As in the above-described third modification (FIG. 2C) of the first embodiment, a large number of opening portions 26c are provided in the plate-like portion 26 in the portion on the outer side of the formation area of the foot portion 27, the opening portions 26c penetrating the plate-like portion 26 in the thickness direction thereof. The opening portions 26c can be formed by using a method such as pressing, as described above. The other configuration is same as that of the second embodiment (FIG. 3), and thus description thereof is omitted.

According to the heat spreader 25c of the third modification, the heat radiation area of the portion of the plate-like portion 26 on the outer side of the formation area of the foot portion 27 can be increased as in the above modifications, although there is a difference in configuration that the opening portions 26c are provided in place of the projected portions 26a and 26b of the first and second modifications. This can further improve the heat radiation property. Moreover, although having the same configuration as that of the heat spreader 20c (FIG. 2C) according to the third modification of the first embodiment described above, the second embodiment (FIG. 3) has the heat sink 24 mounted in the area on the inner side of the formation area of the foot portion 27. Thus, spaces above and below the portion of the plate-like portion 26 on the outer side of the formation area of the foot portion 27 are left open. Thus, focusing on the portions on the outer side of the formation area of the foot portion 27, the heat radiation property is further improved compared to that of the third modification (FIG. 2C) of the first embodiment described above.

The above embodiments have been described by taking, as examples, the semiconductor devices 30 and 30a in which the chip capacitors 11 are mounted on the package 12 together with the semiconductor chip 10. However, as is apparent from the gist of the invention (providing a foot portion of a radiation component at a predetermined position in a region on the inner side of the periphery of a plate-like portion), chip capacitors are not necessary mounted. Moreover, the present invention is applicable to a device with a passive element (resistor element, for example) other than a chip capacitor mounted thereon.

The point is that any device having the following configuration is sufficient. An electronic component requiring heat radiation is mounted on a wiring board (package), and the electronic component is bonded to a heat-radiating component (heat spreader) through a thermal interface material (TIM) interposed therebetween. The present invention is applicable in a similar manner to an electronic component device with such structure.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A heat-radiating component capable of being bonded via a thermal interface material to an electronic component mounted on a wiring board, the heat-radiating component comprising:
    a plate-like portion thermally bonded to the electronic component through the thermal interface material; and
    a foot portion formed on a surface which faces the electronic component, of the plate-like portion,
    wherein the foot portion is formed in a ring shape at a position which surrounds a region corresponding to a mounting area of the electronic component, on the inner side of the periphery of the plate-like portion, and the foot portion being bonded to the wiring board,
    wherein the plate-like portion has an outer part whose lower surface is flat over all in an outer region from the foot portion, and a region between the outer part of the plate-like portion and the wiring board is opened,
    and a large number of projected portions are provided at least on one surface of the plate-like portion on which the foot portion is formed, the projected portions being provided on the outer part of an outside of the foot portion.

2. The heat-radiating component according to claim 1, wherein the projected portions are made of carbon nanotube.

3. A heat-radiating component capable of being bonded via a thermal interface material to an electronic component mounted on a wiring board, the heat-radiating component comprising:
    a plate-like portion thermally bonded to the electronic component through the thermal interface material; and
    a foot portion formed on a surface which faces the electronic component, of the plate-like portion,
    wherein the foot portion is formed in a ring shape at a position which surrounds a region corresponding to a mounting area of the electronic component, on the inner side of the periphery of the plate-like portion, and the foot portion being bonded to the wiring board,
    wherein the plate-like portion has an outer part whose lower surface is flat over all in an outer region from the foot portion, and a region between the outer part of the plate-like portion and the wiring board is opened,
    and a large number of opening portions are provided on the outer part of an outside of the foot portion in the plate-like portion, the opening portions penetrating the plate-like portion in a thickness direction thereof.

4. An electronic component device comprising:
    a wiring board;
    an electronic component mounted on the wiring board;
    a heat-radiating component bonded via a thermal interface material to the electronic component, the heat-radiating component including
        a plate-like portion thermally bonded to the electronic component through the thermal interface material, and a foot portion formed on a surface which faces the electronic component, of the plate-like portion,
wherein the foot portion is formed in a ring shape at a position which surrounds a region corresponding to a mounting area of the electronic component, on the inner side of the periphery of the plate-like portion, the foot portion being bonded to the wiring board; and
a further heat-radiating component mounted on a surface of the plate-like portion on the opposite side to the surface facing the electronic component,
wherein the plate-like portion has an outer part whose lower surface is flat over all in an outer region from the foot portion, and a region between the outer part of the plate-like portion and the wiring board is opened,
and the further heat-radiating component is mounted on the inner side of a formation area of the foot portion in the plate-like portion, and a large number of projected portions are provided on both surfaces of the plate-like portion, on the outer part of an outside of the foot portion in the plate-like portion.

* * * * *